United States Patent
Verma et al.

(10) Patent No.: US 10,360,340 B2
(45) Date of Patent: Jul. 23, 2019

(54) OVERLAY DISPLAY OF DATA FROM DIFFERENT DATABASES

(71) Applicant: Oracle International Corporation, Redwood City, CA (US)

(72) Inventors: Rupesh Verma, Fremont, CA (US); Anuj Trivedi, Dublin, CA (US); Yao-Cheng Tien, Milpitas, CA (US)

(73) Assignee: Oracle International Corporation, Redwood Shores, CA (US)

( * ) Notice: Subject to any disclaimer, the term of this patent is extended or adjusted under 35 U.S.C. 154(b) by 303 days.

(21) Appl. No.: 15/285,692

(22) Filed: Oct. 5, 2016

(65) Prior Publication Data

US 2018/0096095 A1    Apr. 5, 2018

(51) Int. Cl.
| | |
|---|---|
| *G06F 17/50* | (2006.01) |
| *G09G 5/377* | (2006.01) |
| *G06F 3/0481* | (2013.01) |
| *G06F 16/25* | (2019.01) |
| *G06F 3/0485* | (2013.01) |
| *G06F 3/0482* | (2013.01) |
| *G09G 5/14* | (2006.01) |

(52) U.S. Cl.
CPC ........ *G06F 17/5081* (2013.01); *G06F 3/0481* (2013.01); *G06F 16/252* (2019.01); *G06F 17/5009* (2013.01); *G09G 5/377* (2013.01); *G06F 3/0482* (2013.01); *G06F 3/0485* (2013.01); *G06F 2203/04804* (2013.01); *G06F 2203/04806* (2013.01); *G09G 5/14* (2013.01); *G09G 2340/10* (2013.01)

(58) Field of Classification Search
USPC ..................................................... 716/139
See application file for complete search history.

(56) References Cited

U.S. PATENT DOCUMENTS

| | | | |
|---|---|---|---|
| 7,020,853 B2 | 3/2006 | Skoll | |
| 8,959,448 B2 | 2/2015 | Cappione | |
| 2005/0012753 A1 | 1/2005 | Karlov | |
| 2012/0084725 A1* | 4/2012 | Sirpal | G06F 1/1616 715/802 |
| 2012/0105363 A1* | 5/2012 | Sirpal | G06F 1/1616 345/174 |

(Continued)

OTHER PUBLICATIONS

Xie, et al; "GUIDE: A GUI DifferEntiator"; International Conference on Software Maintenance, Edmonton, AB ; Sep. 20-26, 2009; pp. 395-396.

(Continued)

*Primary Examiner* — Mohammed Alam
(74) *Attorney, Agent, or Firm* — Meyertons, Hood, Kivlin, Kowert & Goetzel, P.C.

(57) ABSTRACT

A method for visually merging design databases without generating a merged database of the design databases is disclosed. A first display window that is to display information from a particular database in non-overlay mode is assigned to the first stack position, and a second display window that is to display information from another database in overlay mode is assigned to a next stack position. The second display window is positioned relative to the first display window using position information received from the first display window via an inter-process communication channel.

20 Claims, 10 Drawing Sheets

(56) References Cited

U.S. PATENT DOCUMENTS

2015/0242070 A1* 8/2015 Sirpal ................... G06F 1/1616
715/761
2015/0302827 A1* 10/2015 Danielsson ............ G01C 23/00
345/581
2018/0096095 A1* 4/2018 Verma ................. G06F 17/5081

OTHER PUBLICATIONS

"Overlay Mixer Filter"; Microsoft; 2016; https://msdn.microsoft.com/en-us/library/windows/desktop/dd390946(v=vs.85).aspx; downloaded from the Internet Mar. 18, 2016.

"Memory and storage in After Effects"; Adobe Systems Incorporated; 2016; https://helpx.adobe.com/after-effects/using/memory-storage1.html; downloaded from the Internet on Mar. 18, 2016.

* cited by examiner

OVERLAY DISPLAY OF DATA FROM DIFFERENT DATABASES

BACKGROUND

Technical Field

Embodiments described herein are related to the field of integrated circuit design, and more particularly to visually merging databases.

Description of the Related Art

Computing systems may include multiple integrated circuits, each of which may include different circuits, such as, e.g., a processor, a radio frequency transceiver, and the like. Each integrated circuit may include multiple circuit blocks each of which may be designed in accordance to one of various design styles.

Computer-aided design (CAD) tools may be used during the design process for a circuit block. Such CAD tools may allow a circuit designer or engineer to describe the logical function of a circuit block using a high-level programming language, or arrange individual transistors when designing analog or mixed-signal circuit blocks.

During the design of a particular circuit block, various forms of analysis may be performed. Such analysis may be made to verify logical operation or to estimate performance, power consumption, or other operational parameters. In some cases, results of an analysis may be compared to design data for a circuit block, such as the physical design of the circuit block, for example. Based on the results of the comparison, the design of the circuit block may be modified and the analysis repeated.

SUMMARY OF THE EMBODIMENTS

Various embodiments of a method for visually merging databases are disclosed. Broadly speaking, a method is disclosed in which a particular database of a plurality of databases is selected, where information included in the particular database is to be displayed in non-overlay mode. A first display window that will display the information included in the particular database is assigned to an initial stack position. A second display window that will display information from another database in overlay mode is assigned to another stack position. Position information sent by the first display window, via an inter-process communication process, is received by the second display window, and the second display window is positioned relative to the first display window using the position information.

In another embodiment, first visual data may be generated using at least a portion of the particular database and second visual data may be generated using at least a portion of the another database. The first visual data may be displayed in the first display window and the second visual data may be displayed in the second display window.

In another non-limiting embodiment, a user action may be received by the second display window. Display information indicative of the user action may be sent by the second display window, via the inter-processing communication channel, to the first display window in response to determining the user action includes at least a pan or zoom operation.

BRIEF DESCRIPTION OF THE DRAWINGS

The following detailed description makes reference to the accompanying drawings, which are now briefly described.

Figure 1:
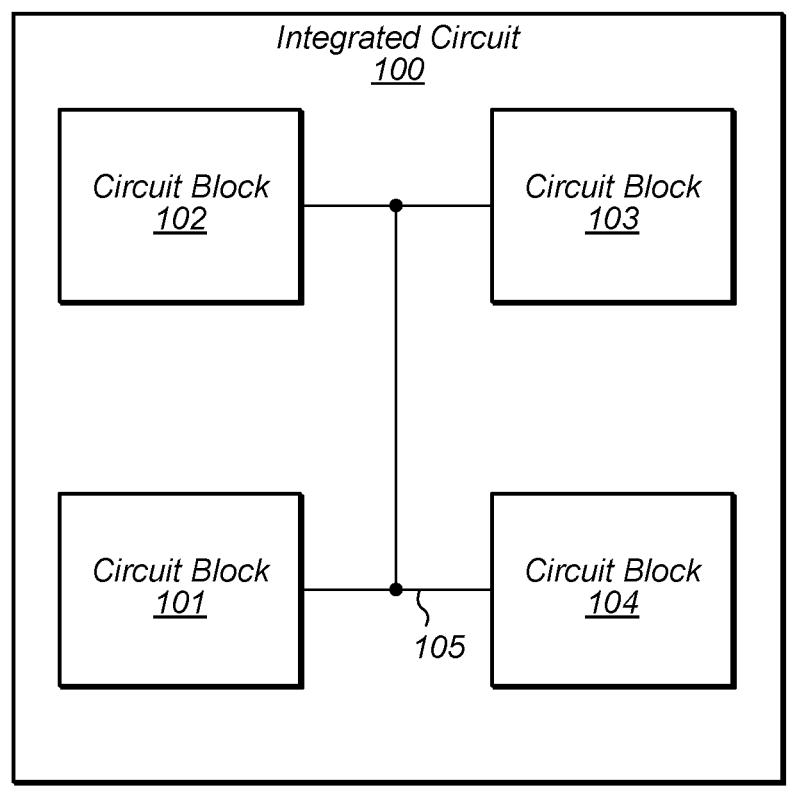
FIG. 1 illustrates an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

An integrated circuit may include one or more circuit blocks, each of which may be designed to perform a particular function or operation. For example, a circuit block may include a processor or processor core configured to execute program instructions retrieved from memory. Based on a particular circuit block's intended function, different design methodologies may be employed.

During the design of a particular circuit block, various simulations or analyses may be performed. Such analyses are employed to determine if the particular circuit block will function correctly, as well as meet desired goals for power consumption, speed of operation, and the like. Results of the analysis may be compared to the design data for the particular circuit block. For example, power analysis results may be compared to the physical design database of the particular circuit block.

The results of an analysis may be compared to design data in various ways. The results and design data may be displayed side-by-side on a computer display, and the circuit design or engineer may visually compare the displayed information. Such a comparison method may be prone to inaccuracies. Alternatively, an intermediate database may be generated by merging the results and the design data.

Merging databases in this fashion may consume large amounts of time and computing resources. The embodiments illustrated in the drawings and described below may provide techniques to visually merge databases while limiting the need to create separate databases which include merged data, or rely on a circuit designer's visual capabilities.

A block diagram depicting an example of an integrated circuit is illustrated in FIG. 1. In the illustrated embodiment, the Integrated Circuit 100 includes Circuit Blocks 101 through 104. Each of Circuit Blocks 101 through 104 are coupled to the other circuit blocks another via communication bus 105.

In various embodiments, each of Circuit Blocks 101 through 104 may be configured to perform different functions. For example, Circuit Block 101 may include a processor or processor core configured to execution program instructions. Alternatively or additionally, Circuit Block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, or a Ferroelectric Random Access Memory (FeRAM).

Circuit Blocks 103 and 104 may include various analog circuits, such as, e.g., a phase-locked loop (PLL), crystal oscillator, or radio frequency (RF) circuits. In other embodiments, Circuit Blocks 103 and 104 may include circuits configured to coordinate data transfer Integrated Circuit 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices.

During the design of Integrated Circuit 100, multiple computer-aided design (CAD) tools may be employed. In some cases, different CAD tools may be used for different circuit blocks based upon a particular circuit block's desired function. For example, portions of a processor or processor core may be designed using a logic synthesis tool operating on a high-level description of the operation of the processor or processor core written in hardware description language (HDL), while a memory design may be generated using schematics capture tool.

As described below in more detail, once a design for particular circuit block is completed, the circuit block may be analyzed to ensure proper operation, performance, and the like. The design of the particular block may then be modified based upon results of the analysis.

It is noted that in the embodiment of an integrated circuit illustrated in FIG. 1, four circuit blocks are depicted. In other embodiments, any suitable number of circuit blocks may be employed.

Circuit blocks, such as, e.g., Circuit Blocks 101 through 104 as illustrated in the embodiment of FIG. 1, may be designed according to one of various design styles. As part of the design process, an iterative analysis and modification methodology may be employed. An example of such a design method is illustrated in the flow diagram depicted in FIG. 2. Referring to the flow diagram of FIG. 2, the method begins in block 201.

A circuit block, such as, e.g., Circuit Block 101, of an integrated circuit may be designed (block 202). In some cases, the circuit block may be designed at the transistor level using a schematics capture CAD tool. Different circuit blocks may be designed at a higher level of abstraction of HDL or other suitable behavioral language description of the functionality of the circuit block.

A physical design of the circuit block may then be generated (block 203). In order to manufacture an integrated circuit, multiple photo masks need to be generated. Such photo masks may be generated from one or more databases containing shape and layer information corresponding to individual transistors and wiring interconnect. In some cases, a CAD tool using a process commonly referred to as "place and route" may generate the shape and layer information. Shape and layer information for other circuit blocks may be generated manually be a designer or engineer.

Once the shape and layer information for the circuit block has been generated, an analysis may be performed on the circuit block (block 204). The analysis may include simulations of circuit performance, such as, e.g., timing, simulations of logical functionality, power consumption, and the like. In some cases, the shape and layer information may be used to determine characteristics, such as, e.g., wiring resistance and capacitance, of the circuit block in a procedure referred to as "parasitic extraction." Such characteristics may be used in the analysis of the circuit block to better predict the circuit block's various performance parameters.

Results of the analysis may then be reviewed (block 205). The CAD tools used to perform the desired analysis on the circuit block may generate respective databases. Such databases may be compared to each other, or to database information relating to the design of the circuit block. As described below in more detail, reviewing the results of the analysis may include visually comparing databases generated by the various CAD tools. The method then depends on the results of the analysis (block 206).

If the results of the analysis are unacceptable, i.e., the circuit block fails to meet desired performance goals, the design of the circuit block may be modified (block 208). In some cases, transistor sizes may be altered, logic gates may be added or different logic gates may be employed. Once the changes have been made to the circuit block, the physical design of the circuit block is updated to reflect the changes made to the design. Using the updated physical design information, the method may then proceed from block 204 as described above.

Figure 2:
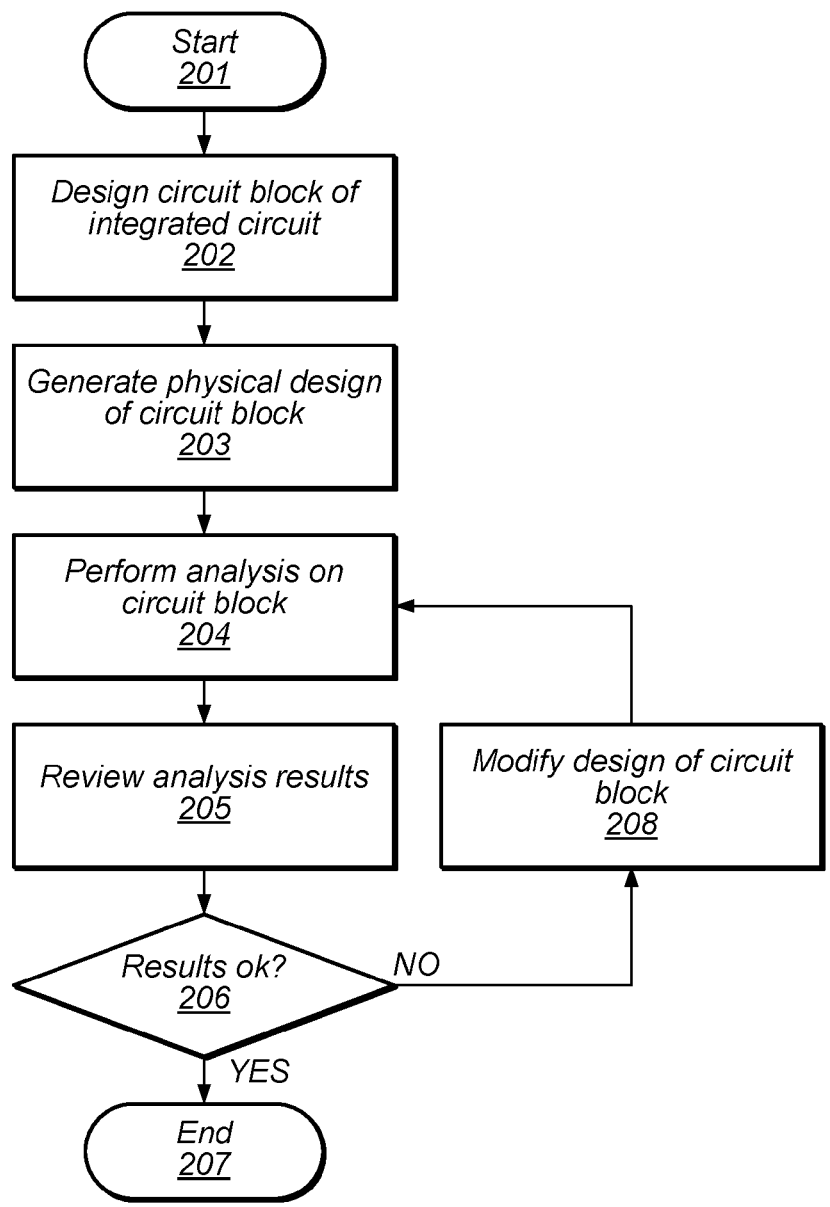
FIG. 2 illustrates a flow diagram of an embodiment of a method for designing an integrated circuit.

If, however, the results of the analysis are acceptable, then the method may conclude in block 207. It is noted that the embodiment of the method illustrated in FIG. 2 is merely an example. In other embodiments, different operations, and different orders of operations may be employed.

Figure 3:
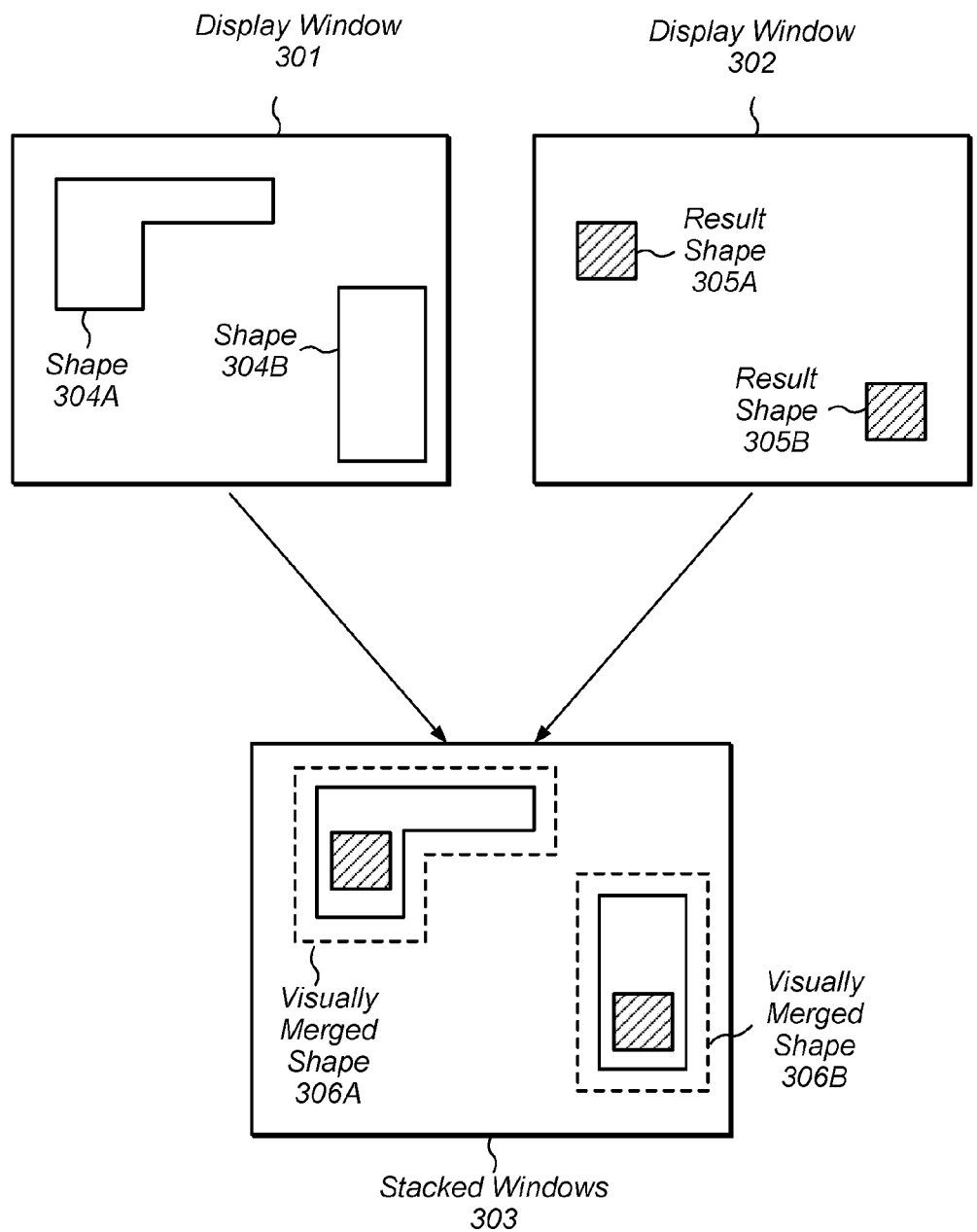
FIG. 3 illustrates a block diagram depicting the display of analysis results during the design of an integrated circuit.

As described above, the review of analysis results of a circuit block may include visually comparing one or more databases. A block diagram depicting the visual comparison of databases is illustrated in FIG. 3.

Information relating to the physical design of the circuit block is displayed in Display Window 301. As used and described herein, a display window is a region of a computer display, in which data associated with a particular process or the execution of particular software program are displayed. In the illustrated embodiment, shapes 304A and 304B are displayed in Display Window 301. Shapes 304A and 304B may correspond to particular shapes on a given mask design layer in the physical design of the circuit block. It is noted that although only two shapes are depicted, in other embodiments, any suitable number of shapes may be employed.

Information relating to an analysis of the circuit block is displayed in Display Window 302. Results Shapes 305A and 305B may, in various embodiments, correspond to regions in the physical design where possible problems exist. For example, Results Shapes 305A and 305B may correspond to locations in the physical design wherein design rule check (DRC) violations exits, or where power dissipation is beyond desired limits, or any other suitable analysis result.

To compare the results of the analysis with physical design, the two display windows are visually merged. As used and described herein, visually merging refers to positioning display windows on top of each other and adjusting the opacity of the information displayed in the display windows to allow underlying shapes to be visible. In the present embodiment, the information displayed in Display Window 301 may be visually merged with the information displayed in Display Window 302, by positioning Display Window 302 on top of Display Window 301. The result of the positioning, indicated as Stacked Windows 303, includes shapes from both Display Window 301 and Display Window 302. As described below in more detail, to position Display Windows 301 and 302 to form Stacked Windows 303, Display Windows 301 and 302 are linked together so that changes in the magnification or display location of a particular one of Display Windows 301 and 302 are propagated to the remaining display window. Visually Merged Shape 306A includes Shape 304A and Result Shape 305A, and Visually Merged Shape 306B includes Shape 304B and Result Shape 305B.

In various embodiments, the opacity of Result Shapes 305A and 305B may be adjusted when the display windows are linked, to allow the underlying Shapes 304A and 304B to remain visible. By adjusting the opacity of Result Shapes 305A and 305B to allow underlying shapes to be visible, information from different databases may be displayed together without having to pre-process the different databases into a single merged database thereby saving time in the design cycle. The software program associated with each display window generates visual data for its respective display window using data from a particular database, excluding other databases to be included in the comparison.

Although only the comparison of two databases is illustrated in the block diagram of FIG. 3, in other embodiments, any suitable number of databases may be compared.

Figure 4:
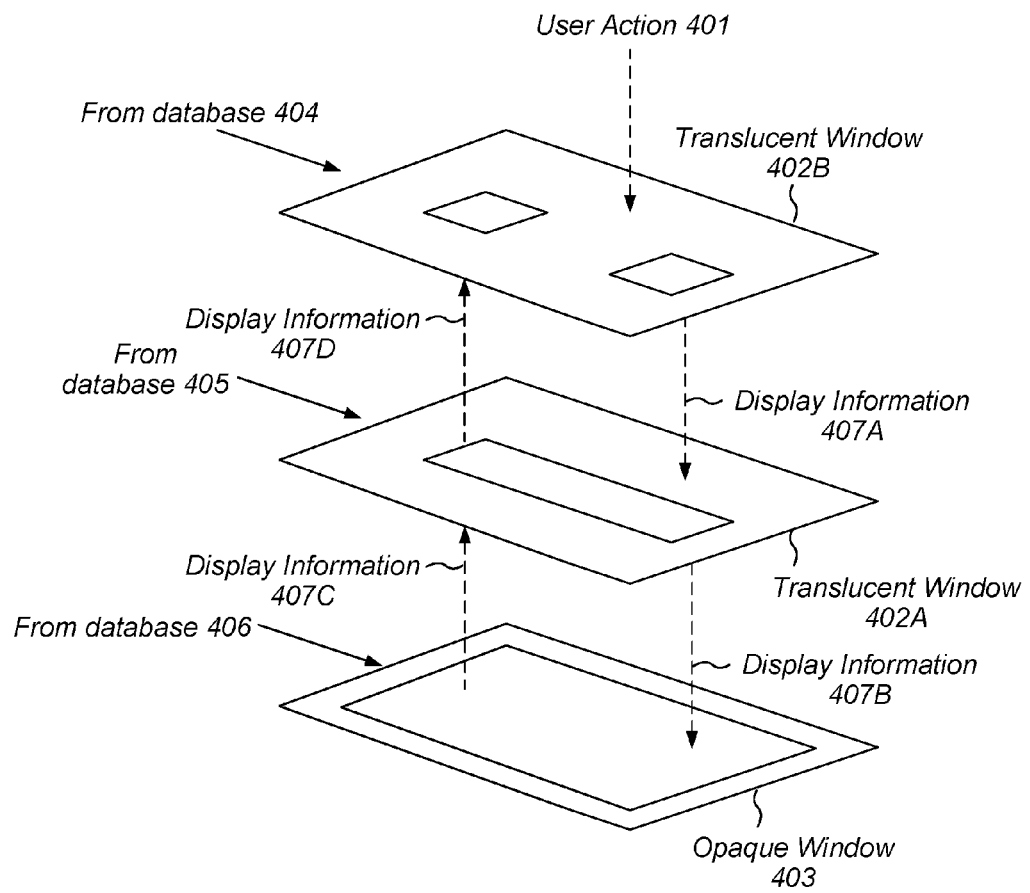
FIG. 4 illustrates a block diagram depicting overlaying display windows.

Turning to FIG. 4, an example of overlaying display windows is depicted. Each of the display windows depicted in FIG. 4 may be an output of a CAD tool or other software program used in the design and analysis of integrated circuits. In the illustrated embodiment, information from database 406 is displayed in Opaque Window 403. The information from database 406 may, in various embodiments, include data associated with the physical design of a circuit block of an integrated circuit. The opacity of Opaque Window 403 may be set such that other visual data being displayed on a computer display may not be visible through Opaque Window 403.

Information from database 405 is displayed in Translucent Window 402A. In some embodiments, the information included in database 405 may correspond to results of an analysis of the circuit block. Translucent Window 402 may be aligned with and placed on top of Opaque Window 403, and the magnification and position information of Translucent Window 402A may be set to be substantially the same as those of Opaque Window 402A. The opacity of Translucent Window 402A may be set to allow the information being displayed in Opaque Window 403 to be visible through Translucent Window 402.

Information from database 404 is displayed in Translucent Window 402B. As with the information from database 405, the information included in database 404 may correspond to results of an analysis of the circuit block. Translucent Window 402B may also be aligned to both Translucent Window 402A and Opaque Window 403. As with Translucent Window 402A, the opacity of Translucent Window 402B may be set to allow the shapes displayed in both Opaque Window 403 and Translucent Window 402A to be visible. The magnification and position information associated with Translucent Window 402B may also be substantially the same as the information associated with Translucent Window 402A and Opaque Window 403.

In addition, to the various display windows being aligned, magnification and position information may be transferred between the various display windows. A CAD tool or other suitable piece of software (referred to herein as "merge software") may manage the transfer of the magnification and position information between software programs or CAD tools corresponding to the display windows. By allowing the transfer of magnification and position information between the software programs corresponding to the various display windows, a circuit designer or engineer can examine specific portions of the design of a circuit block while the display windows displaying the analysis results track the changes in magnification and position.

In the illustrated embodiment, User Action 401 may be received in Translucent Window 402B. Such user action may correspond to a change in the position within the database, a change in magnification, or any other suitable adjustment to the information being displayed in Translucent Window 402B. Information, such as, e.g., Display Information 407A, resulting from User Action 401 may be transferred to a software program associated with Translucent Window 402A by the merge software. The merge software may further relay Display Information 407B to the software program associated with Opaque Window 403.

The relaying of display information may be bidirectional. For example, during initial setup, the merge software may relay Display Information 407C and Display Information 407D from Opaque Window 403 to the software programs associated with Translucent Windows 402A and 402B, respectively. By relaying display information in this fashion, Translucent Windows 402A and 402B may configured to display their respective database information according to the initial magnification and position information associated with Opaque Window 403.

It is noted that the embodiment illustrated in FIG. 4 is merely an example. In other embodiments, different numbers and different arrangements of display windows are possible and contemplated.

Figure 5:
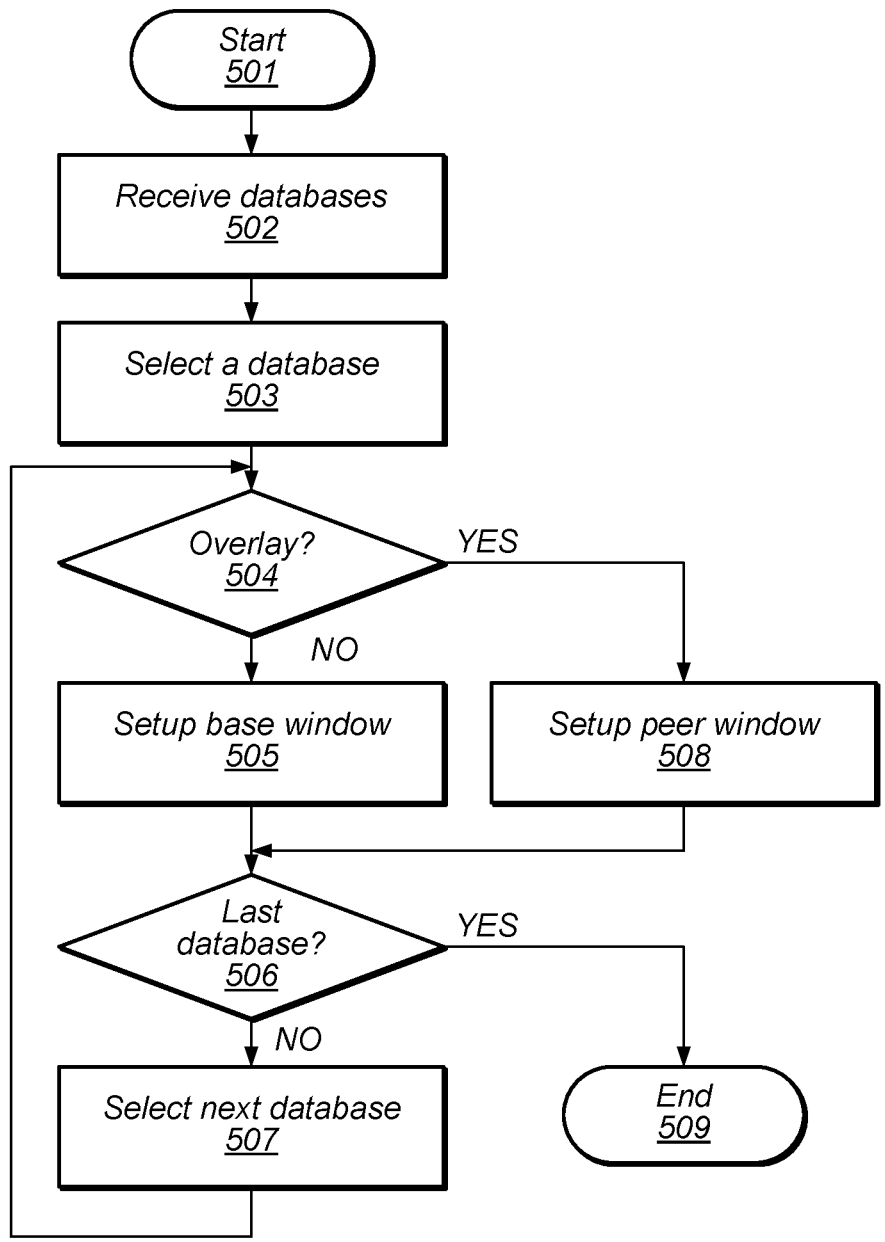
FIG. 5 illustrates a flow diagram depicting an embodiment of a method for merging display windows associated with various databases.

An embodiment of a method for merging display windows associated with various databases is depicted in the flow diagram of FIG. 5. In various embodiments, the operations performed in the flow diagram of FIG. 5 may be the result of execution program instructions associated with merge software. Referring collectively to FIG. 4 and the flow diagram of FIG. 5, the method begins in block 501.

Databases 404 through 406 may then be received (block 502). In various embodiments, one of the aforementioned databases may correspond to a physical design of an integrated circuit or any suitable portion thereof. Other databases may correspond to analysis data, such as, e.g., thermal or power dissipation, circuit performance, and the like, for the integrated circuit.

One of databases 404 through 406 may then be selected (block 503). Each of the databases may be encoded with information indicating that the information associated with the database is to be displayed as an overlay over another database's information. Alternatively, such overlay information may be stored in a separate file that is read by the merge software. The method then depends on the overlay information associated with selected database (block 504).

If the selected database includes information that is not to be displayed as an overlay, then a base display window (also referred to herein as a "base window") is setup (block 505). As described below in more detail, the setup of the base window may include retrieving initial magnification and position information associated with the base window. In some embodiments, an existing display window associated with the selected database may be identified as the base window. If a current window associated with the selected database if not available, a CAD tool or other software program may be invoked, using the selected database, to generate a display window that will be used as the base window.

If the selected database includes information that is to be displayed as an overlay, then a peer display window (also referred to herein as a "peer window") is setup (block 508). As described below in more detail, the setup of a peer window may include passing magnification and position information retrieved from the software program associated with a base window to the software program associated with the peer window. As with the base window, an existing display window associated with the selected database may be identified as the peer window, or a CAD tool or software program may be invoked, using the selected database, to generate a display window to be used as a peer window.

Whether the information included in the selected database is to be displayed as an overlay or not, once the appropriate type of window has been setup, the method may then depend on if there are any remaining databases (block 506).

If the selected database is the last of the received databases, the method may conclude in block 509. Alternatively, if other databases remain to be processed, then a new database may be selected (block 507). Once the new database is selected, the process may proceed from block 504 as described above.

It is noted that the embodiment of the method illustrated in FIG. 5 is merely an example. In other embodiment, different operations and different orders of operations may be employed.

As described above, when the information included in a database is not to be displayed as an overlay, a base window is setup. An embodiment of method for setting up a base window is depicted in the flow diagram illustrated in FIG. 6. In various embodiments, the method depicted in FIG. 6 may correspond to block 505 of the flow diagram of FIG. 5. The method begins in block 601.

A window associated with the database whose information is to be displayed may then be named (block 602). The name may be provided by a user, or may be generated by the merge software.

The merge software may maintain relative positions of various display windows to be merged. Each of the display windows may occupy a particular position in the collection or "stack" of windows. In the present embodiment, since the information associated with the selected database is not going to be displayed as on overlay, the display window associated with the selected database (the base window) is assigned to position zero in the stack (block 603).

Once a position in the stack has been assigned to the base window, the merge software may open an inter-process communication channel with the software program generating the base window (block 604). Many CAD tools allow for other software programs to request data from the CAD tool while it is operating. Such requests and resultant data may be through a communication channel between the merge software and a particular CAD tool or software program. The data may, in various embodiments, include data indicative of a magnification factor associated with the window, or a current position (such as a location of the center of the display window relative to the corresponding database). The inter-process communication may also allow the merge software to send instructions to a given CAD tool or software program that are to be executed upon receipt.

Figure 6:
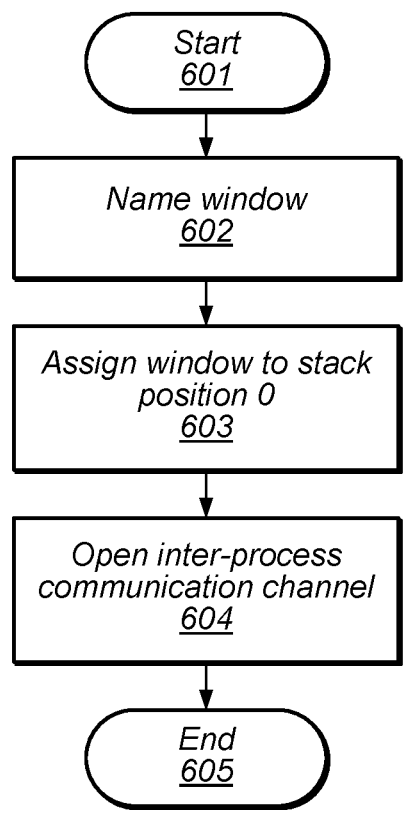
FIG. 6 illustrates a flow diagram depicting an embodiment of a method for setting up a base window during a display window merging operation.

Once the inter-process communication channel has been opened, the method may conclude in block 605. Although the operations included in the flow diagram of FIG. 6 are depicted as being performed in a sequential fashion, in other embodiments, two or more of the operations may be performed in parallel.

Figure 7:
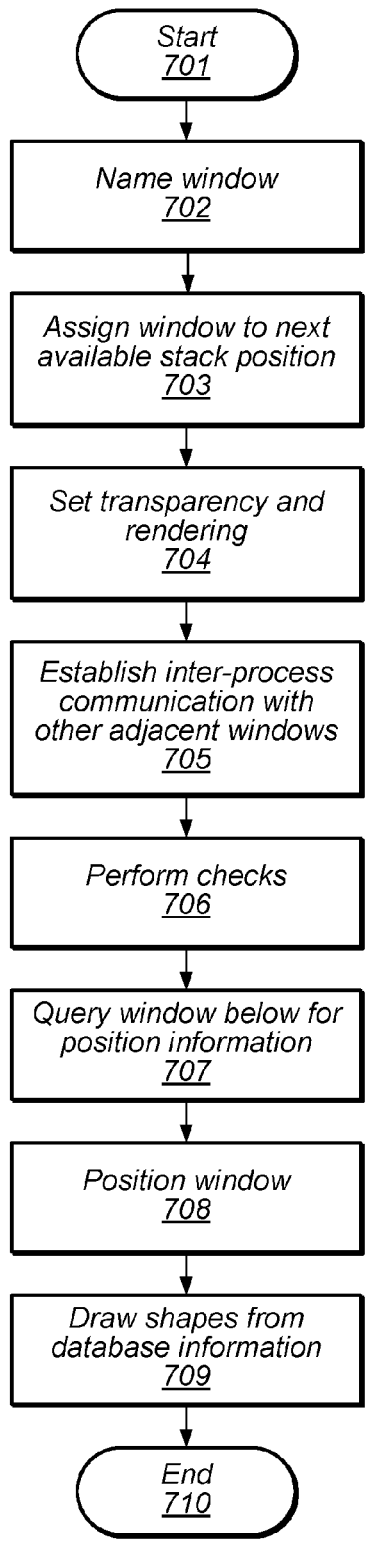
FIG. 7 illustrates a flow diagram depicting an embodiment of a method for setting up a peer window during a display window merging operation.

Different operations are performed to setup a peer window. A flow diagram depicting an embodiment of a method for setting up a peer window is illustrated in FIG. 7. In various embodiments, the method illustrated in FIG. 7 may correspond to block 508 of the flow diagram of FIG. 5. The method begins in block 701.

The display window that is to become a peer window may then be named (block 702). The name may be assigned by a user, or may be generated by the merge software. The merge software may then assign a position in the stack to the peer window (block 703). In some embodiments, the merge software may assign a next available position in the stack to the peer window. Alternatively, the position in the stack may be assigned using any suitable algorithm.

The transparency, or opacity, may then be set for the peer window (block 704). In some embodiments, a level of transparency may be dependent upon the position in the stack. Additionally, parameters governing the rendering of graphics data displayed in the peer window may also be set.

As with the base window, an inter-processing communication channel may be setup for the peer window (block 705). The inter-processing communication channel may allow the transfer of display information between the peer window, the base window, and other peer windows. In some case, the merge software may facilitate such transfers of display information.

One more checks may then be performed (block 706). Before information from a particular database may be displayed relative to information from other databases, several checks may be performed. For example, a type of coordinate system associated with the various databases may be checked. If the types of coordinate systems are found to be different, the information included in one of the databases may need to be scaled before the information may be displayed.

The window located in a next lower stack position may then be queried to determine position information (block 707). In various embodiments, the position information may be obtained using an Application Programming Interface (API) included as part of Graphical User Interface (GUI) associated with the window in the new lower stack position. Using the obtained position information, the peer window may then be positioned on the display of the computing system (block 708).

Once the window has been positioned, shapes generated using the information included in the database associated with the peer window may then be displayed in the peer window (block 709). In various embodiments, the shapes are displayed using the transparency (or opacity) parameters and in accordance with any rendering settings previously determined. Once the shapes are displayed, the setup of the peer window concludes in block 710.

It is noted that the embodiment of the method illustrated in FIG. 7 is merely an example. In other embodiments, different operations or different orders of operations may be employed.

Once the base window and the various peer windows are setup, the circuit designer or engineer may begin to review analysis results using the stacked display windows. As part of the analysis, the circuit designer or engineer may provide input to modify how the information in the various display windows is to be displayed. An embodiment of a method for modifying the display is depicted in the flow diagram illustrated in FIG. 8. Referring collectively to FIG. 4 and the flow diagram of FIG. 8, the method begins in block 801.

Opaque Window 403 may then receive Display Information 407B from Translucent Window 402B (block 802). The action information may be the result of User Action 401 being transferred down through Translucent Windows 402A and 402B. The method then depends on the type of information included in User Action 401 (block 803).

If the Display Information 407B is not related to a pan or zoom function, the method may conclude in block 806. Alternatively, if Display Information 407B is related to a pan or zoom function, the data displayed in Opaque Window 403 may then be adjusted based on the pan and/or zoom function (block 804). In various embodiments, the CAD tool or software program associated with Opaque Window 403 may calculate new display coordinates for the shapes, determine new shapes to be displayed, or any other suitable operation in accordance with the requested pan or zoom operation. The CAD tool or software program may repaint the display data in Opaque Window 403 once new shape data has been determined.

Once Opaque Window 403 has been updated, the CAD tool or software program associated with Opaque Window 403 waits for new display information (block 805). The method may then continue from block 802 as described above until the review session using the overlayed display windows has ended.

Figure 8:
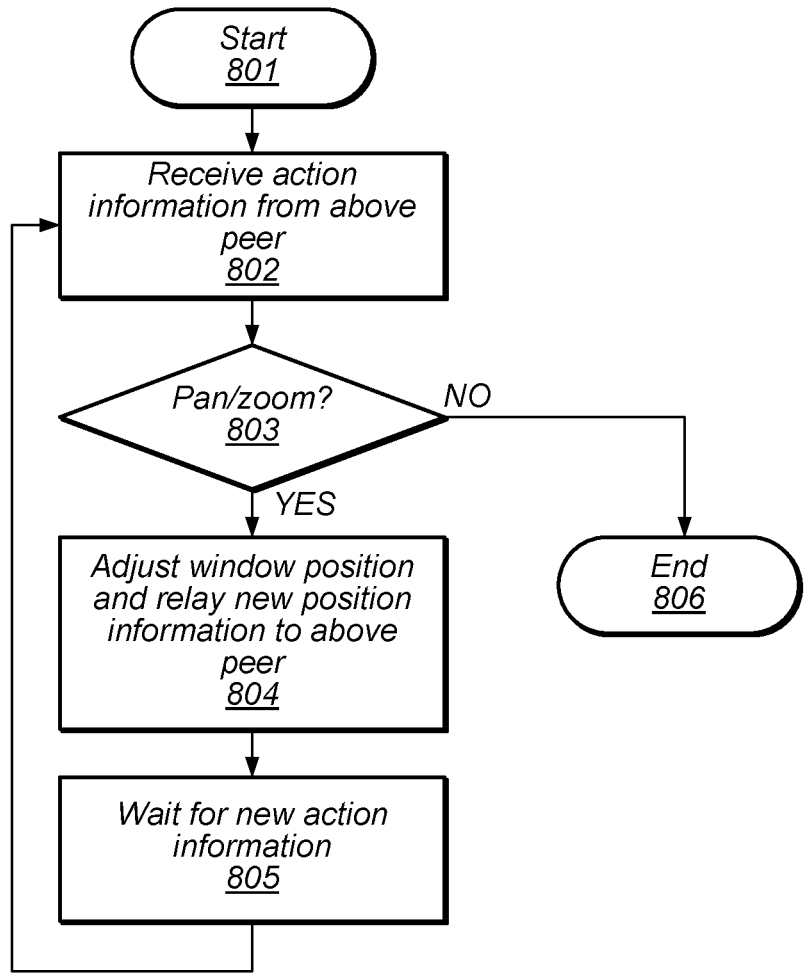
FIG. 8 illustrates a flow diagram depicting an embodiment of a method for modifying display information in a base window.

Although the operations included in the flow diagram of FIG. 8 are depicted as being performed in a serial fashion, in other embodiments, some of the included operations may be performed in parallel.

When a peer window receives updated display information, the processing of the received information is somewhat different. An embodiment of a method for a peer window to process display information is illustrated in the flow diagram depicted in FIG. 9. Referring collectively to FIG. 4 and the flow diagram of FIG. 9, the method begins in block 901.

The software program associated with Translucent Window 402A may then receive Display Information 407A from the software program associated with Translucent Window 402B (block 902). In various embodiments, Display Information 407A may be generated in response to software program associated with Translucent Window 402B receiving User Action 401 from a circuit designer or engineer. The method may then depend on the type of information included in Display Information 407A (block 903).

If Display Information 407A is not related to a pan or zoom function, the method may conclude in block 907. Alternatively, if Display Information 407A is related to a pan or zoom function, the software program associated with Translucent Window 402A may relay the pan and/or zoom information to Opaque Window 403 via Display Information 407B (block 904). As described above in regard to FIG. 8, the software program associated with Opaque Window 403 will update the display in Opaque Window 403 and then relay the updated display information to Translucent Window 402A via Display Information 407C.

The software program associated with Translucent Window 402A may then receive the updated display information via Display Information 407C (block 905). Using the updated display information, the software program associated with Translucent Window 402A may then update the data being displayed in Translucent Window 402A (block 906). Such an update may include determining a new relative position for previously displayed shapes, adding new shapes, removing one or more previously displayed shapes, and the like. With the update of the data being displayed in Translucent Window 402A, the software associated with Translucent Window 402A may be ready to receive further display information and the method may proceed from block 902 as described above.

Figure 9:
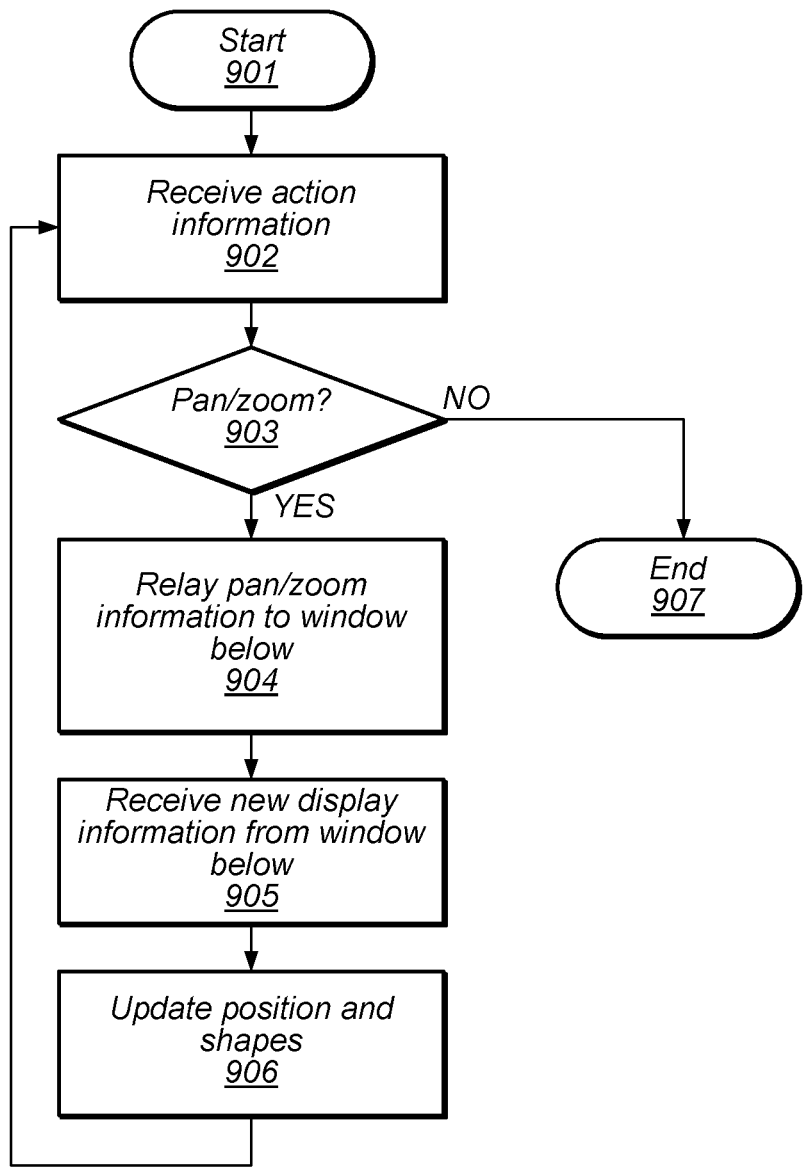
FIG. 9 illustrates a flow diagram depicting an embodiment of a method for modifying display information in a peer window.

It is noted that the embodiment of the method illustrated in the flow diagram of FIG. 9 is merely an example. In other embodiments, different operations and different orders of operations are possible and contemplated.

Figure 10:
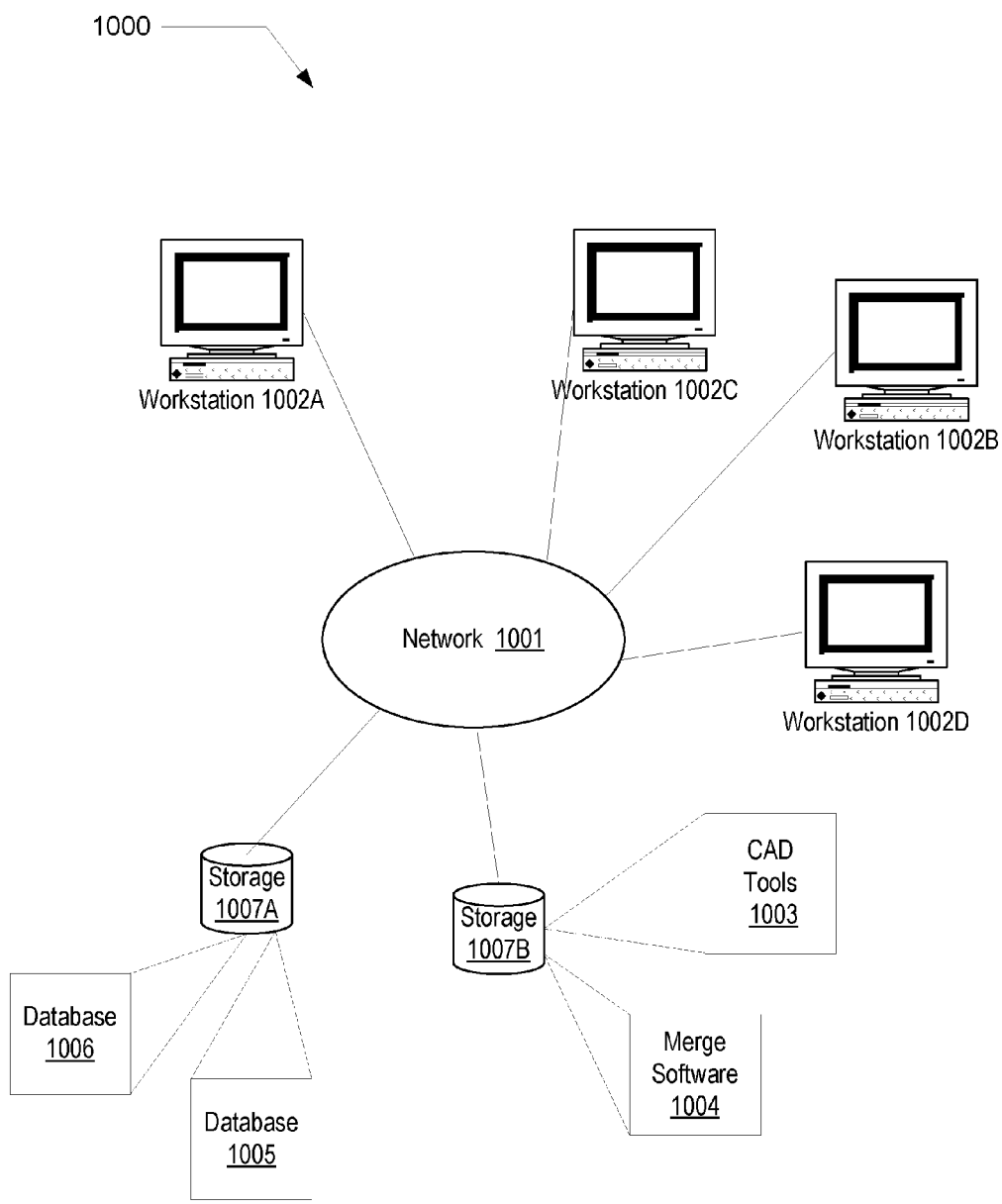
FIG. 10 illustrates a block diagram of a computing system.

When designing an integrated circuit, one or more databases relating to each circuit block included within the integrated circuit may be generated. Using various CAD tools and a computing system, the design for a particular circuit block may be analyzed and modifications made to the design of the particular circuit block. Turning to FIG. 10, a block diagram of one embodiment of a computing system including CAD tools is illustrated. The computing system 1000 includes a plurality of workstations designated 1002A through 1002D. The workstations are coupled together and to a plurality of storage devices designated 1007A and 1007B through a network 1001. In one embodiment, each of workstations 1002A-1002D may be representative of any standalone computing platform that may include, for example, one or more processors, local system memory including any type of random access memory (RAM) device, monitor, input/output (I/O) means such as a network connection, mouse, keyboard, monitor, and the like (many of which are not shown for simplicity).

In one embodiment, storage devices 1007A and 1007B may be representative of any type of mass storage device such as hard disk systems, optical media drives, tape drives, ram disk storage, and the like. As such, program instructions comprising various CAD tools may be stored within either of the storage devices 1007A and 1007B and loaded into the local system memory of any of the workstations during execution. As an example, as shown in FIG. 7, CAD tools 1003, and place and Merge Software 1004 are shown stored within storage device 1007B.

In various embodiments, one or more display windows may be generated by CAD Tools 1003 and displayed on a display associated with any of workstations 1002A-1002D. The display windows generated by CAD Tools 1003 may be stacked as described above in regard to FIG. 5 by Merge Software 1004. In various embodiments, CAD Tools 1003 and Merge Software 1004 may be executed on any suitable combination of workstations 1002A-D. CAD Tools 1003 may use and/or generate one or more databases. Such databases may be stored in storage devices 1007A and 1007B. For example, in the present embodiment, databases 1005 and 1006 are stored in storage device 1007A.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method, comprising:
    selecting a first database of a plurality of integrated circuit design databases, wherein information included in the first database is to be displayed in a non-overlay mode;
    assigning, by a first software program, a first display window generated by a second software program to display the information included in the first database to first stack position;
    selecting a second database of the plurality of integrated circuit design databases, wherein information included in the second database is to be displayed in an overlay mode;
    assigning, by the first software program, a second display window generated by a third software program to display the information included in the second database to second stack position;
    receiving, by the first software program from the second software program, position information associated with the first display window through an inter-process communication channel between the first software program and the second software program;
    determining, by the first software program, a position of the second display window relative to the first display window using the position information; and
    positioning, by the first software program, the second display window over the first display window using the position of the second display window to overlay information included in the second database over information included in the first database.

2. The method of claim 1, further comprising:
    generating first visual data using at least a portion of the first database;
    displaying the first visual data in the first display window;
    generating second visual data using at least a portion of the second database and excluding the portion of the first database; and
    displaying the second visual data in the second display window.

3. The method of claim 2, further comprising receiving, by the second display window, a user action, and sending, via the inter-processing communication channel, display information indicative of the user action to the first display window in response to determining the user action includes at least a pan or zoom operation.

4. The method of claim 3, further comprising modifying first visual data using the display information to generate updated visual data, and displaying, by the first display window, the updated visual data.

5. The method of claim 4, further comprising sending, by the first display window, updated display information indicative of the updated visual data to the second display window.

6. The method of claim 1, wherein the first database includes physical design information for an integrated circuit design, and wherein the second database includes result data from an analysis of the integrated circuit design.

7. A non-transitory computer-accessible storage medium having program instructions stored therein that, in response to execution by a computer system, causes the computer system to perform operations including:
    selecting a first database of a plurality of integrated circuit design databases, wherein information included in the first database is to be displayed in a non-overlay mode;
    assigning, by a first software program, a first display window generated by a second software program to display the information included in the first database to first stack position;
    selecting a second database of the plurality of integrated circuit design databases, wherein information included in the second database is to be displayed in an overlay mode;
    assigning, by the first software program, a second display window generated by a third software program to display the information included in the second database to second stack position;
    receiving, by the first software program from the second software program, position information associated with the first display window through an inter-process communication channel between the first software program and the second software program;
    determining, by the first software program, a position of the second display window relative to the first display window using the position information; and
    positioning, by the first software program, the second display window over the first display window using the position of the second display window to overlay information included in the second database over information included in the first database.

8. The non-transitory computer-accessible storage medium of claim 7, wherein the operations further include:
    generating first visual data using at least a portion of the first database;
    displaying the first visual data in the first display window;
    generating second visual data using at least a portion of the second database and excluding the portion of the first database; and
    displaying the second visual data in the second display window.

9. The non-transitory computer-accessible storage medium of claim 8, wherein the operations further include receiving by the second display window, a user action, and sending, via the inter-processing communication channel, display information indicative of the user action to the first display window in response to determining the user action includes at least a pan or zoom operation.

10. The non-transitory computer-accessible storage medium of claim 9, wherein the operations further include modifying first visual data using the display information to generate updated visual data, and displaying, by the first display window, the updated visual data.

11. The non-transitory computer-accessible storage medium of claim 10, wherein the operations further include sending, by the first display window, updated display information indicative of the updated visual data to the second display window.

12. The non-transitory computer-accessible storage medium of claim 7, wherein the operations further include setting a first transparency level for the first display window using the first stack position, and setting a second transparency level for the second display window using the next stack position.

13. The non-transitory computer-accessible storage medium of claim 7, wherein the first database includes physical design information for an integrated circuit design, and wherein the second database includes result data from an analysis of the integrated circuit design.

14. A system, comprising:
one or more memories configured to store instructions; and
one or more processors configured to receive instructions from the one or more memories and execute the instructions to cause the system to perform operations including:
selecting a first database of a plurality of integrated circuit design databases, wherein information included in the first database is to be displayed in a non-overlay mode;
assigning, by a first software program, a first display window generated by a second software program to display the information included in the first database to first stack position;
selecting a second database of the plurality of integrated circuit design databases, wherein information included in the second database is to be displayed in an overlay mode;
assigning, by the first software program, a second display window generated by a third software program to display the information included in the second database to second stack position;
receiving, by the first software program from the second software program, position information associated with the first display window through an inter-process communication channel between the first software program and the second software program;
determining, by the first software program, a position of the second display window relative to the first display window using the position information; and
positioning, by the first software program, the second display window over the first display window using the position of the second display window to overlay information included in the second database over information included in the first database.

15. The system of claim 14, wherein the operations further include:
generating first visual data using at least a portion of the first database;
displaying the first visual data in the first display window;
generating second visual data using at least a portion of the second database and excluding the portion of the first database; and
displaying the second visual data in the second display window.

16. The system of claim 15, wherein the operations further include receiving by the second display window, a user action, and sending, via the inter-processing communication channel, display information indicative of the user action to the first display window in response to determining the user action includes at least a pan or zoom operation.

17. The system of claim 16, wherein the operations further include modifying first visual data using the display information to generate updated visual data, and displaying, by the first display window, the updated visual data.

18. The system of claim 17, wherein the operations further include sending, by the first display window, updated display information indicative of the updated visual data to the second display window.

19. The system of claim 14, wherein the operations further include setting a first transparency level for the first display window using the first stack position, and setting a second transparency level for the second display window using the next stack position.

20. The system of claim 14, wherein the first database includes physical design information for an integrated circuit design, and wherein the second database includes result data from an analysis of the integrated circuit design.

* * * * *